United States Patent [19]

Tanaka et al.

[11] Patent Number: 5,662,848
[45] Date of Patent: Sep. 2, 1997

[54] PLASTIC MOLDING METHOD FOR SEMICONDUCTOR DEVICES

[75] Inventors: Sueyoshi Tanaka; Zyunzi Sakakibara; Yasutsugu Tsutsumi, all of Fukuoka, Japan

[73] Assignee: Mitsubishi Denki Kabushiki Kaisha, Tokyo, Japan

[21] Appl. No.: 602,679

[22] Filed: Feb. 16, 1996

Related U.S. Application Data

[60] Continuation of Ser. No. 300,533, Sep. 6, 1994, abandoned, which is a division of Ser. No. 113,823, Aug. 31, 1993, Pat. No. 5,366,364.

[30] Foreign Application Priority Data

Sep. 1, 1992 [JP] Japan ..................... 4-233488

[51] Int. Cl.[6] ............... B29C 33/10; B29C 45/02; B29C 45/14
[52] U.S. Cl. ............... 264/102; 264/272.17; 264/328.4; 264/328.5; 425/546; 425/116; 425/121
[58] Field of Search ............... 425/544, 116, 425/572, 546, 121; 264/272.15, 272.17, 102, 328.4, 328.5, 328.1

[56] References Cited

U.S. PATENT DOCUMENTS

| | | | |
|---|---|---|---|
| 3,555,620 | 1/1971 | Bucy | 425/546 |
| 4,044,984 | 8/1977 | Shimizu | 425/116 |
| 4,372,740 | 2/1983 | Kuramochi et al. | 425/544 |
| 4,383,672 | 5/1983 | Kreuttner | 425/192 R |
| 4,573,900 | 3/1986 | Smith | 425/546 |
| 4,793,785 | 12/1988 | Osada | 425/116 |
| 4,797,236 | 1/1989 | Kojima | 425/546 |
| 4,983,111 | 1/1991 | Tsutsumi et al. | 425/116 |
| 5,059,112 | 10/1991 | Wieser | 425/546 |
| 5,059,379 | 10/1991 | Tsutsumi et al. | 264/272.17 |
| 5,082,615 | 1/1992 | Sakai | 264/272.17 |
| 5,108,278 | 4/1992 | Tsutsumi et al. | 264/272.17 |
| 5,116,450 | 5/1992 | Spoo et al. | 425/192 R |
| 5,147,821 | 9/1992 | Mc Shane et al. | 437/212 |
| 5,252,051 | 10/1993 | Miyamoto et al. | 425/116 |
| 5,281,121 | 1/1994 | Tsutsumi et al. | 264/272.17 |
| 5,366,364 | 11/1994 | Tanaka et al. | 425/116 |

FOREIGN PATENT DOCUMENTS

| | | | |
|---|---|---|---|
| 847224 | 7/1970 | Canada | 425/546 |
| 293954 | 4/1988 | European Pat. Off. | |
| 3328408 | 8/1983 | Germany. | |
| 51-53565 | 11/1974 | Japan | 425/546 |
| 6364331 | 9/1986 | Japan. | |
| 62-261132 | 11/1987 | Japan | 264/272.17 |
| 62-273742 | 11/1987 | Japan. | |
| 153555 | 3/1989 | Japan. | |
| 5-111932 | 5/1993 | Japan | 425/546 |
| 6-850 | 1/1994 | Japan | 425/546 |
| 2263085 | 7/1993 | United Kingdom. | |

*Primary Examiner*—Angela Ortiz
*Attorney, Agent, or Firm*—Leydig, Voit & Mayer

[57] ABSTRACT

A plastic molding method for semiconductor devices, the method including placing semiconductor devices mounted on lead-frames between lower die cavities in a lower die chase block and upper die cavities in an upper die chase block and clamping the upper and lower die chase blocks together; evacuating an ejector chamber in the lower die chase block through a lower die common surface table, evacuating an ejector chamber in the upper die chase block through an upper die common surface table, and evacuating a parting chamber at a parting surface between the lower die chase block and the upper die chase block through one of the lower die common surface table and the upper die common surface table; and injecting a sealing resin into the upper die cavities and the lower die cavities to plastically package the semiconductor devices.

13 Claims, 7 Drawing Sheets

FIG. 9 PRIOR ART

PLASTIC MOLDING METHOD FOR SEMICONDUCTOR DEVICES

This disclosure is a continuation of patent application Ser. No. 08/300,533, filed Sep. 6, 1994, now abandoned, which is a division of patent application Ser. No. 08/113,823, filed Aug. 31, 1993, now U.S. Pat. No. 5,366,364.

BACKGROUND OF THE INVENTION

1. Field of the Invention

The present invention relates to a plastic molding apparatus and a plastic molding method for semiconductor devices and, more particularly, to a plastic molding apparatus and a plastic molding method for semiconductor devices in which plastic molding is performed by using a transfer molding press.

2. Description of the Related Art

Plastic molding apparatus for semiconductor devices are generally designed to perform molding by feeding a resin tablet in a transfer pot into cavities under pressure by means of a plunger after upper and lower die plates mounted on a transfer molding press have been clamped.

The aforementioned type of conventional plastic molding apparatus for semiconductor devices includes: an upper die plate, having a transfer pot in which a plunger for pressurizing a resin tablet is advanced or retracted, and cavities which define one half of a plurality of resin packages; a lower die plate disposed below the upper die plate in such a manner that it can advance or retract, with cavities defining the other halves of the packages; and an ejector mechanism accommodated in each of the upper and lower die plates and having ejector pins which move into and away from the cavities.

Since the transfer pot is open to the atmosphere in the thus-arranged plastic molding apparatus for semiconductor devices, the air entering the transfer pot during insertion of the plunger is mixed into the molten resin due to the pressurization of the plunger and forms voids in the packages which seal the semiconductor chips.

Hence, in the aforementioned type of plastic molding apparatus for semiconductor devices, a suction device has been used during resin molding to evacuate the interior of the transfer pot and cavities and thereby prevent entry of air into the packages.

Figure 9:
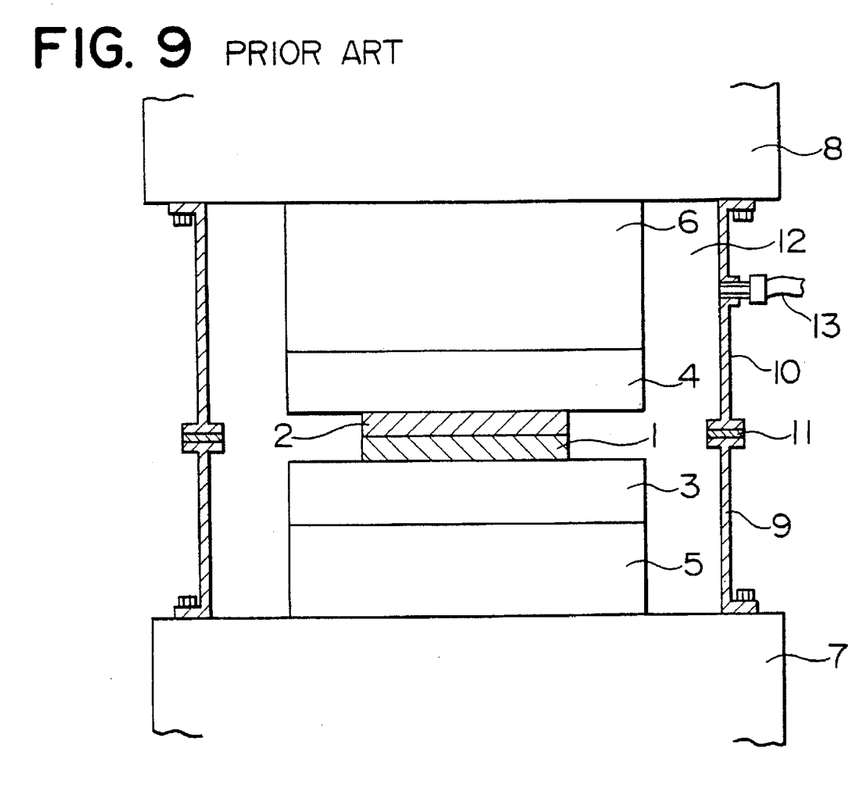
FIG. 9 is a schematic view of a conventional plastic molding apparatus for semiconductor devices.

FIG. 9 is a schematic view of the conventional plastic molding apparatus for encapsulating semiconductor devices. In the figure, a lower chase block 1 and an upper chase block 2, each having cavities (not shown), are respectively fixed to a lower surface table 3, in which a heater (not shown) is incorporated, and an upper surface table 4. A lower die 5 includes the lower chase block 1, the lower surface table 3 and a lower ejector mechanism (not shown), and is fixed to a lower platen 7 for pressing. An upper die 6 includes the upper chase block 2, the upper surface table 4 and an upper ejector mechanism (not shown) and is fixed to an upper platen 8 for pressing. An upper die sealing cover 9 is disposed on the outer periphery of the lower die 5, and is fixed to the lower platen 7. An upper die sealing cover 10 is disposed on the outer periphery of the upper die 6, and is fixed to the upper platen 8. A mating surface between the lower die sealing cover 9 and the upper die sealing cover 10 is sealed by means of a sealing material 11. The upper die sealing cover 10 is provided with an evacuation duct 13 connected to an evacuation device (not shown) so as to evacuate the interior of the lower die sealing cover 9 and upper die sealing cover 10, thereby forming a vacuum chamber 12.

In the thus-arranged conventional plastic molding apparatus for semiconductor devices, the plastic packaging operation is performed in the manner described below. First, semiconductor devices die bonded and wire bonded to leadframes are mounted on the lower chase block 1. Next, clamping is performed by driving a press mechanism to obtain the configuration shown in FIG. 9. After clamping, a resin tablet is charged into a chamber (not shown) in the upper die 6, a plunger (not shown) is fitted into the chamber, and an evacuation device is activated to evacuate the entire interior of the apparatus. When a predetermined degree of vacuum is obtained, the plunger is activated to press the resin tablet and thereby inject the resin, whereby packages sealing the semiconductor devices are molded.

A similar conventional plastic packaging apparatus for semiconuctor devices to that described above is disclosed in Japanese Patent Laid-Open No. 63-64331.

The aforementioned type of plastic molding apparatus has a large overall size. Also, since the volume of the vacuum chamber 12 is large, a long evacuation time and a large evacuating device are necessary.

Furthermore, a change in the package types requires removal of the lower die sealing cover 9 and the upper die sealing cover 10 and loading and unloading of the upper die 6 which weighs about 1000 Kg. Thus, it takes about two days including the time for heating to complete an upper die exchange.

SUMMARY OF THE INVENTION

Accordingly, an object of the present invention is to provide a plastic molding apparatus for semiconductor devices which ensures that both a chase block portion and a common surface table portion are evacuated to produce a vacuum, and which enables the chase block portion alone to be exchanged in a quick die change (QDC) method when package types are changed.

Another object of the present invention is to provide a plastic molding apparatus and a plastic molding method for semiconductor devices in which evacuation passages are separately provided and the volume of a vacuum chamber is reduced so as to achieve improvement in the evacuation performance and in the plastic sealing performance and to reduce the space for installation.

In order to achieve the above objects, according to one aspect of the present invention, there is provided a plastic molding apparatus which includes a lower die having a lower die chase block portion and a lower die common surface table portion, and an upper die having an upper die chase block portion and an upper die common surface table portion, the upper die opposing the lower die, and in which plastic packaging of semiconductor devices is performed in cavities provided in the lower die chase block portion and the upper die chase block portion. The plastic molding apparatus further includes a first evacuation passage via which an ejector chamber formed in the lower die chase block portion is evacuated through the lower die common surface table portion, a second evacuation passage via which an ejector chamber formed in the upper die chase block portion is evacuated through the upper die common surface table portion, and a third evacuation passage via which a parting chamber formed on a parting surface between the lower die chase block portion and the upper die chase block portion is evacuated through either the lower die common surface table portion or the upper die common surface table portion.

According to another aspect of the present invention, there is provided a plastic molding method for semiconductor devices which comprises the steps of mounting semiconductor devices on leadframes between lower die cavities formed in a lower die chase block portion and upper die cavities formed in an upper die chase block portion and clamping upper and lower dies, evacuating an ejector chamber in the lower die chase block portion through a lower die common surface table portion, evacuating an ejector chamber in the upper die chase block portion through an upper die common surface table portion, evacuating a parting chamber on a parting surface between the lower die chase block portion and the upper die chase block portion through either the lower die common surface table portion or the upper die common surface table portion, and injecting a sealing resin into the lower die cavities and the lower die cavities to plastically package the semiconductor devices.

DETAILED DESCRIPTION OF THE PREFERRED EMBODIMENTS

Figure 1:
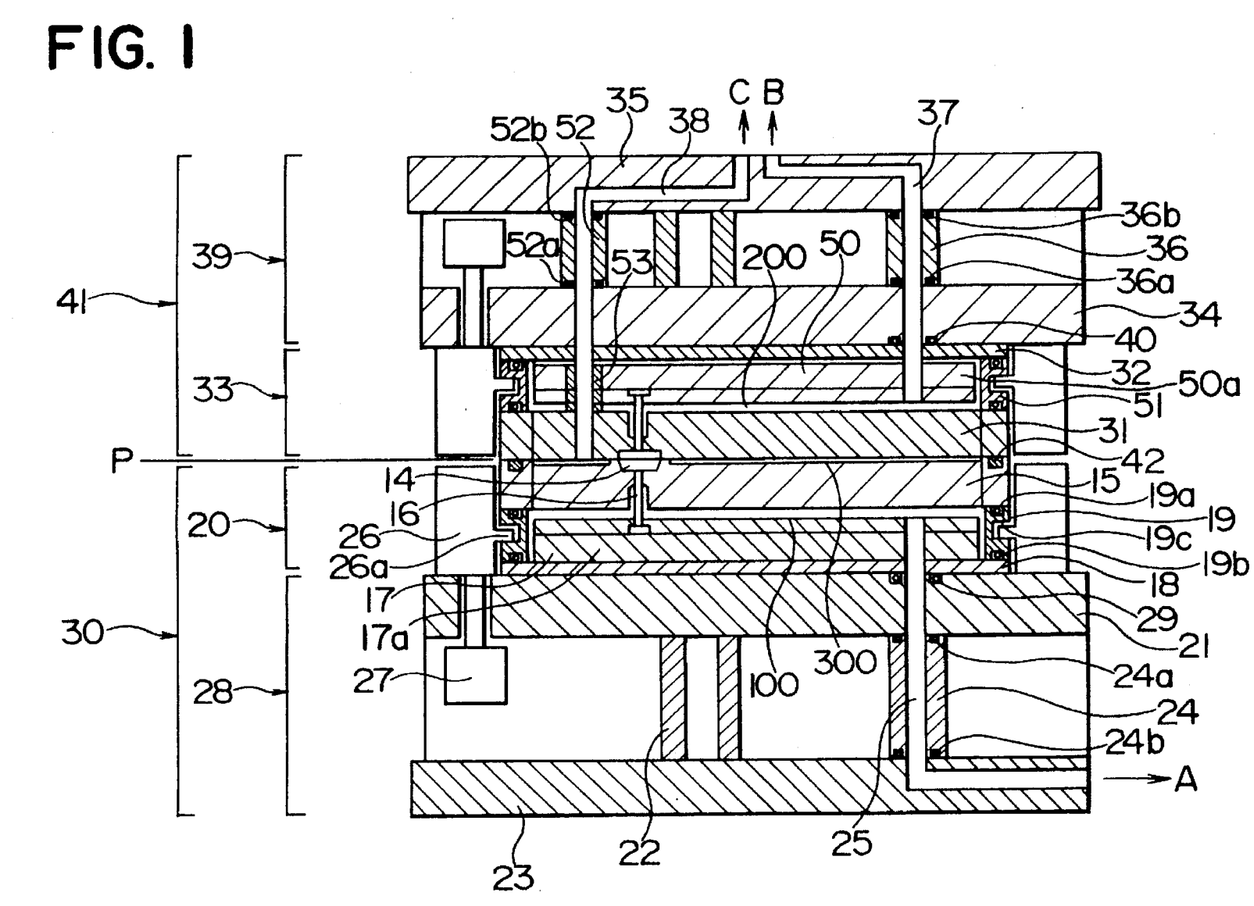
FIG. 1 is a lateral cross-sectional view of a plastic molding apparatus for semiconductor devices showing a first embodiment of the present invention.

FIG. 1 is a cross-sectional view of a plastic molding apparatus for semiconductor devices showing a first embodiment of the present invention. In the accompanying drawings, the same reference numerals are used to denote similar or identical elements. Referring to FIG. 1, the structure of a lower die 30 will be described first.

A lower die chase 15 has lower die cavities 14. A package (not shown) molded in one of the lower die cavities 14 is ejected by means of an ejector pin 16. The plurality of ejector pins 16 are moved up and down by means of an ejector plate 17a. A lower die ejector mechanism 17 includes this ejector plate 17a and a spring (not shown). The other end of each of elastic posts 22 for supporting the lower die chase 15 abuts against a lower die packing plate 18 for receiving the press clamping pressure. A vacuum-sealed type lower die chase block 20 includes the lower die packing plate 18, the lower die chase 15, an annular frame 19 disposed on the outer periphery of the lower die ejector mechanism 17, and sealing materials 19a and 19b disposed at the two ends of the frame 19. In the lower die chase block 20, an ejector chamber 100 surrounded by the lower die chase 15, the lower die ejector mechanism 17 and the frame 19 is formed.

A lower die surface table 21 in which a heater (not shown) is incorporated is supported by one end of each of the elastic posts 22. The other end of each of the elastic posts 22 is received by a lower die base 23. In the lower die surface table 21 and the lower die base 23, a first evacuation passage 25 through which the thus-arranged ejector chamber 100 is evacuated is provided. The first evacuation passage 25 communicates with a pipe 24. Sealing materials 24a and 24b are provided on the two ends of the pipe 24. The interior of the ejector chamber 100 is evacuated by means of an evacuating device which is not shown via the first evacuation passage 25 at arrow by A in FIG. 1. Although the first evacuation passage 25 is provided in the lower die base 23, it may also be provided in the lower die surface table 21.

The frame 19 has a recessed portion 19c which engages with a protrusion 26a of a rail 26, whereby the lower die chase block 20 is fixed to the rail 26. The rail 26 is moved up and down by means of an air cylinder 27 a lower die chase lifting mechanism. The lower die surface table 21 and the air cylinder 27 are part of a lower die common surface table 28. The lower die chase block 20 is mounted on the surface of the lower die common surface table 28. The first evacuation passage 25 is vacuum sealed by means of a sealing material 29. Both the lower die chase block 20 and the lower die common surface table 28 are part of a lower die 30.

An upper die 41 is constructed in the same way as that of the lower die 30. More specifically, an upper die chase block 33 includes an upper die chase 31, an upper die packing plate 32 and so on. An upper die common surface table 39 includes an upper die surface table 34, an upper die base 35 and so on. In the upper die chase block 33, an ejector chamber 200 is surrounded by the upper die chase 31, an upper die ejector mechanism 50 having an ejector plate 50a, and a frame 51. In the upper die surface table 34 and the upper die base 35, a second evacuation passage 37 is formed to evacuate the thus-arranged ejector chamber 200. The second evacuation passage 37 communicates with a pipe 36. Sealing materials 36a and 36b are provided at the two ends of the pipe 36. The interior of the ejector chamber 200 is evacuated by means of an evacuating device (not shown) via the second evacuation passage 200 from a location B in FIG. 1.

The upper die chase block 33 is mounted on the surface of the upper die common surface table 39. The vacuum evacuation passage 37 is sealed by a sealing material 40 at the interface between the upper die chase block 33 and the upper die common surface table 39. Both the upper die chase block 33 and the upper die common surface table 39 are part of the upper die 41.

Vacuum sealing of a parting line P between the lower and upper dies 30 and 41 is effectively accomplished by the pressing of a sealing ring 42 provided in a groove formed in the outer periphery of the lower die chase 15. A parting chamber 300 is formed on the parting surface containing the cavities 14 of the parting line P. In the upper die surface table 34 and the upper die base 35, a third evacuation passage 38 is provided to evacuate the parting chamber 300. The third evacuation passage 38 communicates with a pipe 53. Sealing materials 52a and 52b are provided at the two ends of the pipe 52. The interior of the parting chamber 300 is evacuated by means of an evacuating device (not shown) via the third evacuation passage 38 from a location C in FIG. 1. Although the third evacuation passage 38 is evacuated through the upper die common surface table 39, it may also be evacuated from the lower die common surface table 28. Furthermore, in order to prevent resin impurities from entering the ejector chamber 200, the second and third evacuation passages 37 and 38 are provided separately, and an evacuation pipe 53 is provided in the portion of the upper die ejector mechanism 50 through which the third evacuation passage 38 passes.

As mentioned above, the ejector chambers 100 and 200 and the parting chamber 300 are respectively evacuated via the three separate passages formed in the lower and upper dies 21 and 41. In this way, the volume of the chamber to be evacuated can be greatly reduced as compared with the conventional apparatus, thus making effective evacuation possible. Also, the size of and the space for the plastic molding apparatus can be reduced, and the quality of the manufactured semiconductor devices can be improved.

In the thus-arranged plastic molding apparatus, plastic packaging is performed in the manner described below. Semiconductor devices which are die-bonded and wire-bonded to the leadframes are mounted on the lower die chase 15, and concurrently with this a resin tablet is charged into a chamber (not shown) which is incorporated in the lower die chase 15. Thereafter, clamping is performed to obtain the state shown in FIG. 1. At that time, the plunger (not shown) incorporated in the lower die 30 is already fitted in the chamber and sealed. After clamping is completed, the evacuating devices are operated. When a predetermined degree of vacuum is obtained, the plunger is operated to press the resin tablet and thereby inject it into the cavities, whereby plastic packages of the semiconductor devices are formed.

Figure 2:
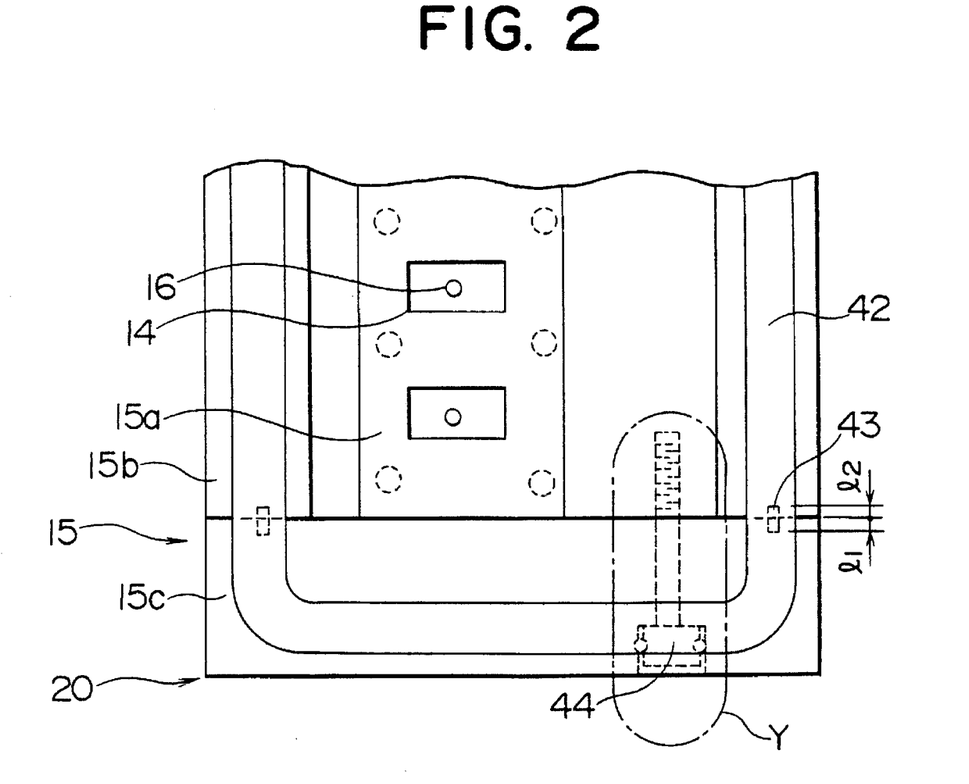
FIG. 2 is a plan view of part of a lower die chase block portion of the plastic molding apparatus shown in FIG. 1.
Figure 3:
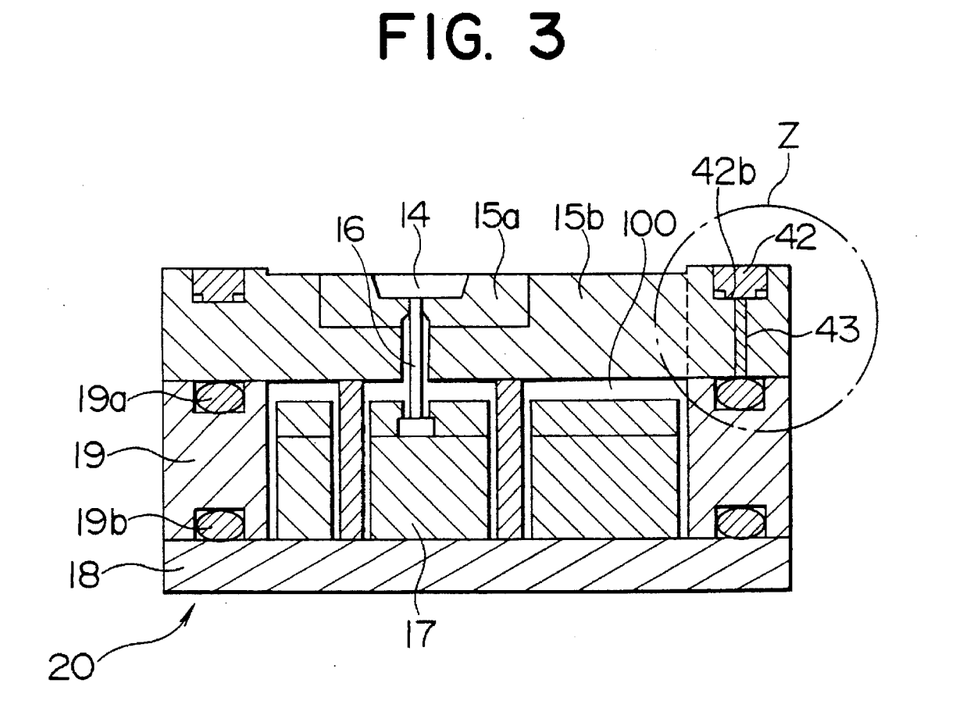
FIG. 3 is a lateral cross-sectional view of the lower die chase block portion of the plastic molding apparatus shown in FIG. 1.

FIGS. 2 and 3 are respectively plan and lateral cross-sectional views of part of the lower die chase block 20 of the plastic molding apparatus shown in FIG. 1. In these figures, a lower die cavity insert 15a is incorporated into the lower die chase 15 to form the lower die cavities 14. The size of the cavity insert 15a can be changed in response to the size of the package and leadframe. The cavity insert 15a is retained by a retainer 15b. In the outer periphery of the upper portion of the retainer 15b, a groove 42b where the sealing ring 42 is provided is formed. At each of the two ends of the cavity insert 15a and retainer 15b, a lower die end plate 15c is disposed. A groove is formed in the upper surface of each of the lower die end plates 15c to receive the sealing ring 42. The mating surface between the retainer 15b and each of the lower die end plates 15c is sealed by means of a vertical seal 43. A groove, which is $l_1=l_2>1$ mm, is formed in the retainer 15b and each of the end plates 15c to receive the vertical seal 43.

Figure 4:
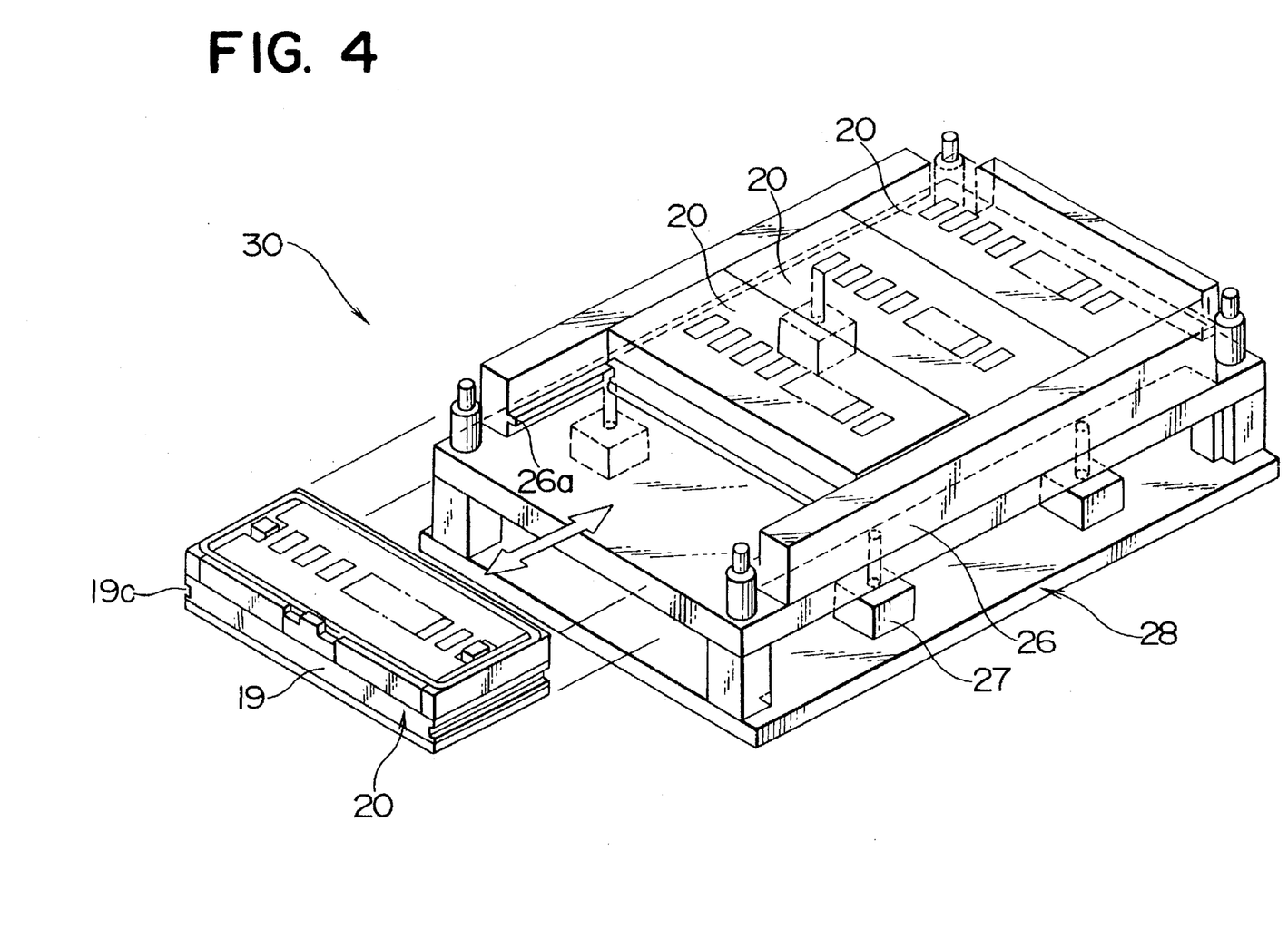
FIG. 4 is a perspective view of a lower die illustrating exchanging the lower die chase block portion by a QDC method.

FIG. 4 is a perspective view of the lower die 30 illustrating exchanging the lower die chase block 20 by the QDC method. The exchange of the lower die chase block 20 will be described below. First, the rail 26 is raised by the air cylinder 27 to fit and push the rail protrusion 26a into the recessed portion 19c in the frame 19 of the lower die chase block 20. Thereafter, the air cylinder 27 is lowered and locked by a locking plate (not shown), whereby mounting of the lower die chase block 20 on the lower die common surface table portion 28 is completed. Since the loser die chase block portion 28 is lifted by the air cylinder 27 and exchanged, as mentioned above, smooth and quick exchange can be performed without damaging the sealing materials.

Communication between the aforementioned evacuation passages is obtained by the time the exchange is completed. The lower die chase block 20 is removed by reversely performing the aforementioned setting operation.

Exchange of the upper die chase block 33 of the upper die 41 can be performed using the upper die chase block lifting mechanism, for example, the air cylinder, in basically same operation as that of the aforementioned lower die 30. The driving source for the lower die chase block portion 20 and upper die chase block portion 33 is not limited to the air cylinder but it may be a motor or the clamping force of the press. Thus, the exchange of the lower die chase block 20 and the upper die chase block 33 can be respectively performed by the QDC method using the lower die chase lifting mechanism and the upper die chase lifting mechanism respectively provided in the lower die common surface table portion and the upper die common surface table portion. Therefore, the time during which the apparatus must be stopped when the package types are changed over is reduced, thus greatly improving productivity.

Figure 5:
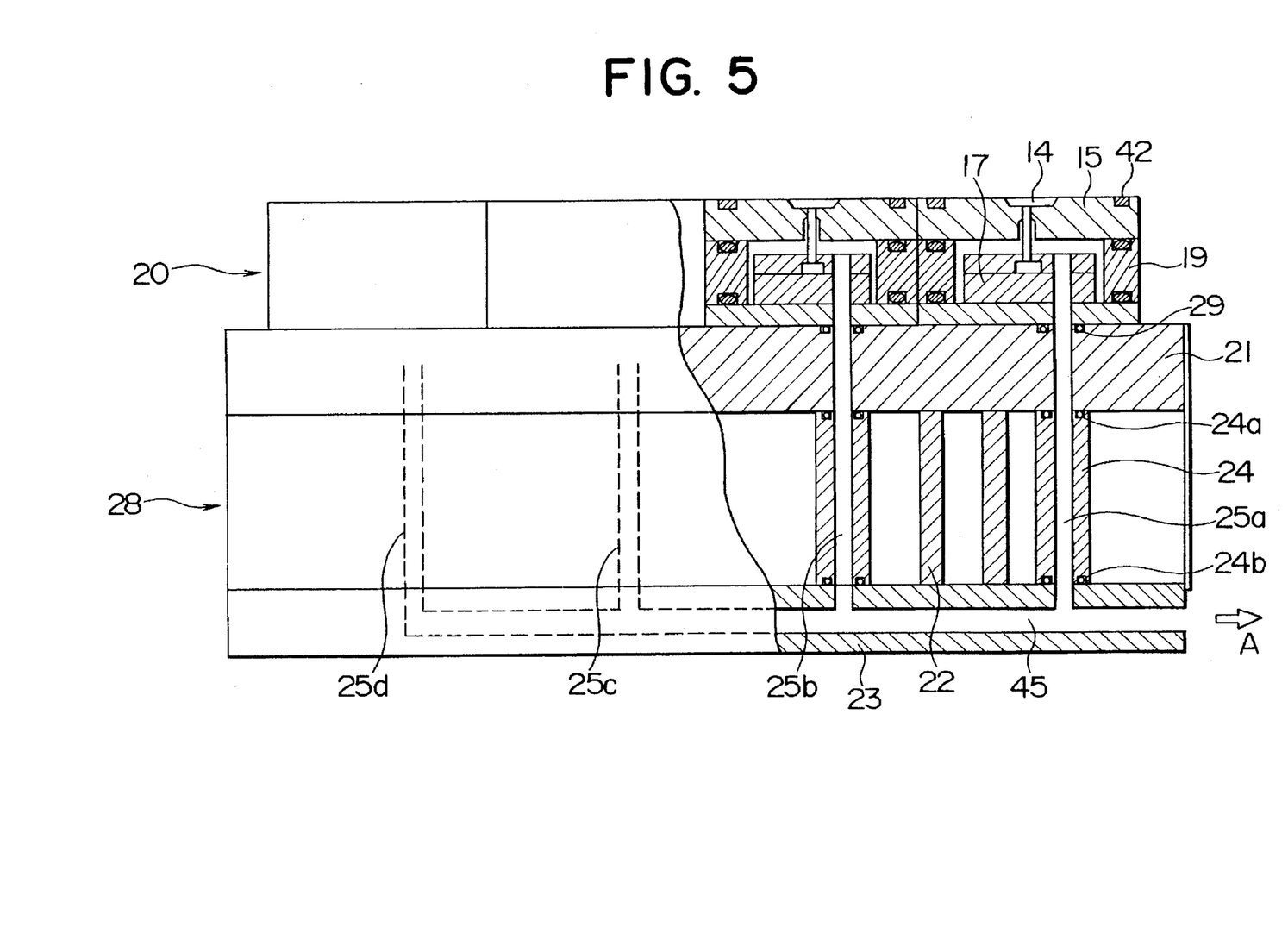
FIG. 5 is a cross-sectional view of part of the lower die.

FIG. 5 is a cross-sectional view of part of the lower die 30. In FIG. 5, four lower die chase blocks 20 are mounted on the lower die common surface table 28. First evacuation passages 25a, 25b, 25c and 25d for respectively evacuating the ejector chambers of the lower die chase block portions 20 are placed in communication with the lower die surface table 21 and the lower die base 23 of the lower die common surface table 28 simply only by the mounting of the lower die chase blocks 20 on the lower die common surface table 28 via the pipes 24. The first evacuation passages 25a through 25d communicate with each other via a manifold 45.

Since the manifold 45 is provided within the lower die common surface table 28, the length of the first evacuation passages 25a through 25d can be while the connection of the evacuation passages in the lower die chase block 20 can be readily obtained by one-touch operation. A manifold may also be provided for the second and third evacuation passages 37 and 38.

Figure 6:
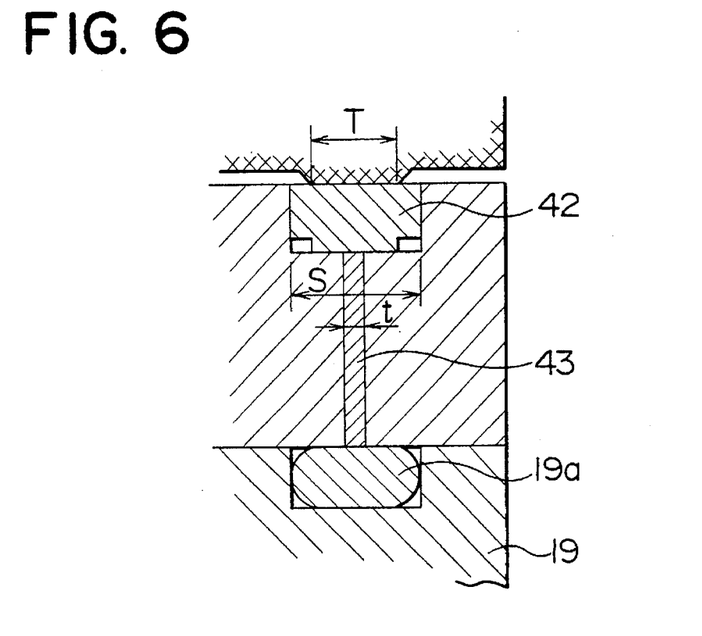
FIG. 6 is an enlarged cross-sectional view of a vertical seal shown in FIG. 3.

FIG. 6 is an enlarged cross-sectional view of portion Z shown in FIG. 3. In the figure, assuming that S is the width of the sealing ring 42, T is the width of the reaction surface which presses against the seal ring 42 (the upper die chase block portion 33) and t is the width of the vertical seal, $t<T<S$. In this way, an adequate amount of pressing force acts on the sealing ring 42 and vertical ring 43, improving the sealing performance. In this embodiment, the sealing ring 42 and the vertical ring 43 are disposed in the lower die chase block 20. However, the sealing ring 42 and the vertical ring 43 may also be provided in the upper die chase lock 33.

Figure 7:
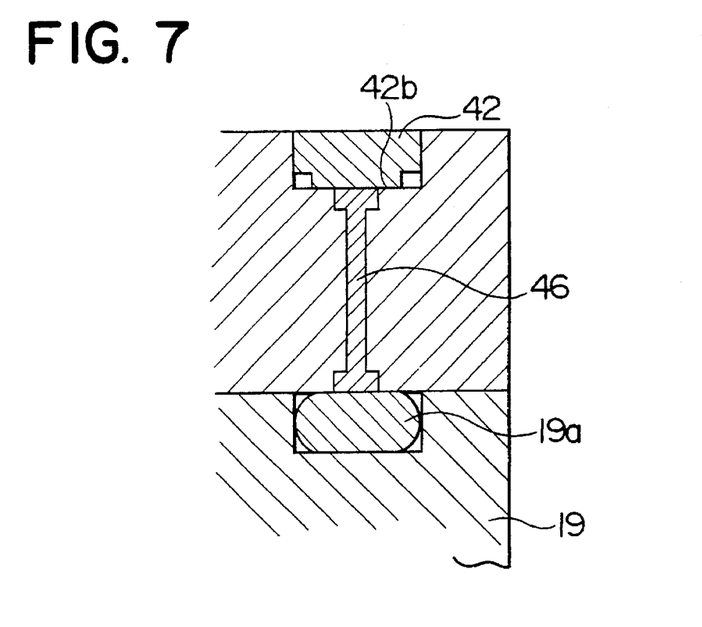
FIG. 7 is an enlarged cross-sectional view of an I type vertical seal.

FIG. 7 is a cross-sectional view showing a modification of the vertical seal 43 shown in FIG. 6. In FIG. 7, a vertical seal 46 having an I-shaped cross-section is provided in place of the vertical seal 43. In this way, the surface pressure of the vertical seal 46 which acts on the sealing material 19a can be increased, and the vertical seal 46 can be made less flexible. It is thus possible to further improve the sealing performance.

Figure 8:
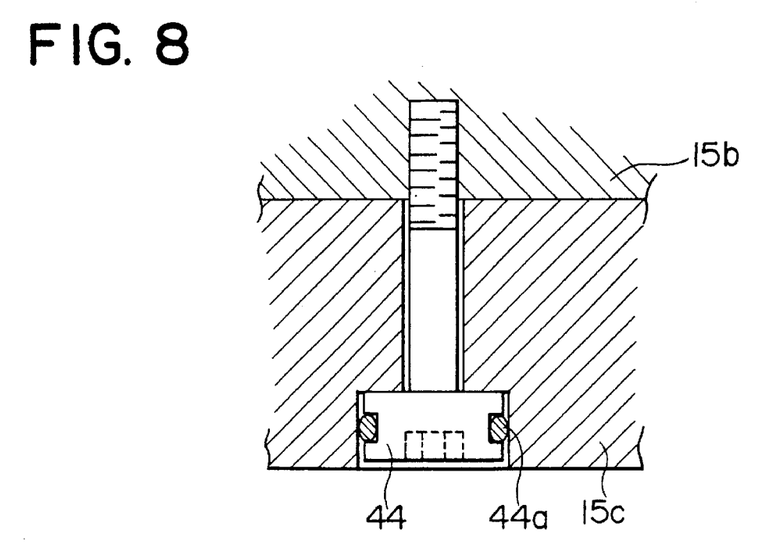
FIG. 8 is an enlarged cross-sectional view of a sealing bolt.

FIG. 8 is an enlarged cross-sectional view of portion Y shown in FIG. 2. In the figure, a sealing bolt 44 for tightening the retainer 15b of the lower die chase block 20 and the lower die end plate 15c is provided. This sealing bolt 44 is effective as the method of sealing the lower die chase block 20 where there are dimensional restrictions. That is, a sealing material 44a is provided at the head of the sealing bolt 44 having a hexagonal, square or polygonal hole to prevent leakage of air from the mating surface between the retainer 15b and the lower die end plate 15c. This sealing method makes sealing of the tightening bolt possible where there are dimensional restrictions, and thus improves the sealing performance.

What is claimed is:

1. A plastic molding method for semiconductor devices, said method comprising the steps of:

placing semiconductor devices mounted on leadframes between lower die cavities in a lower die chase block containing a lower ejector plate and upper die cavities in an upper die chase block containing an upper ejector plate and clamping the upper and lower die chase blocks together between an upper and a lower die common surface table;

evacuating an ejector chamber in said lower die chase block through said lower die common surface table, evacuating an ejector chamber in said upper die chase block through said upper die common surface table, and evacuating a parting chamber at a parting surface between said lower die chase block and said upper die chase block through one of said lower die common surface table and said upper die common surface table; and injecting a sealing resin into said upper die cavities and said lower die cavities to plastically package the semiconductor devices.

2. The method according to claim 1 including evacuating each chamber through a separate conduit.

3. The method according to claim 1 including evacuating each chamber through the ejector plate of one of the die chase blocks.

4. The method according to claim 1 including evacuating at least one of the chambers through a manifold in one of the die common surface tables.

5. The method according to claim 1 including disposing a seal between the upper and lower die chase blocks around a periphery of the parting chamber and pressing a reaction surface projecting from one of the die chase blocks and having a smaller width than the seal into sealing contact with the seal.

6. A plastic molding method comprising:

disposing a first die chase block on a first set of rails supported by a first die common surface table;

disposing a second die chase block on a second set of rails supported by a second die common surface table;

moving the first die chase block along the first set of rails to align an evacuation passage in the first die chase block with an evacuation passage in the first die common surface table;

moving the second die chase block along the second set of rails to align the second die chase block with the first die chase block;

joining the first and second die chase blocks with each other;

evacuating a parting chamber between the first and second die chase blocks through the evacuation passages in the first die chase block and the first die common surface table; and injecting a resin into a die cavity formed in one of the first and second die chase blocks and surrounded by the parting chamber.

7. The method according to claim 6 comprising:

aligning an evacuation passage formed in the second die chase block with an evacuation passage formed in the second die common surface table when aligning the first and second die chase blocks; and evacuating an ejector chamber formed in the second die chase block and containing an ejector plate through the evacuation passages formed in the second die chase block and the second die common surface table.

8. The method according to claim 6 wherein evacuating the parting chamber comprises evacuating through an evacuation passage formed in an ejector plate disposed inside the first die chase block and connected with the evacuation passage in the first die chase block.

9. The method according to claim 6 including moving the first set of rails to bring the first die chase block into contact with the first die common surface table and connect the evacuation passage in the first die chase block with the evacuation passage in the first die common surface table after moving the first die chase block along the first set of rails.

10. A plastic molding method for semiconductor devices comprising:

disposing a semiconductor device in a cavity in one of first and second die chase blocks;

joining the first and second die chase blocks to each other to define a parting chamber surrounding the cavity;

evacuating the parting chamber through a first evacuation passage extending through an ejector plate disposed inside the first die chase block; and injecting a resin into the cavity to plastically package the semiconductor device.

11. The method according to claim 10 comprising evacuating an ejector chamber formed in the first die chase block and containing the ejector plate through a second evacuation passage formed in the ejector plate.

12. The method according to claim 10 comprising evacuating an ejector chamber formed in the second die chase block through a third evacuation passage formed in an ejector plate disposed in the ejector chamber of the second die chase block.

13. The method according to claim 10 comprising supporting the first die chase block on a die common surface table, wherein evacuating the parting chamber includes evacuating through a fourth passage formed in the die common surface table and communicating with the first evacuation passage.

* * * * *